(12) United States Patent
Gregerson et al.

(10) Patent No.: US 7,528,936 B2
(45) Date of Patent: May 5, 2009

(54) SUBSTRATE CONTAINER WITH PRESSURE EQUALIZATION

(75) Inventors: Barry Gregerson, Deephaven, MN (US); David Halbmaier, Shorewood, MN (US); Stephen Sumner, Minneapolis, MN (US); Brian Wiseman, Glencoe, MN (US); Anthony Mathius Tieben, Jordon, MN (US); Justin Strike, Maple Grove, MN (US)

(73) Assignee: Entegris, Inc., Chaska, MN (US)

( * ) Notice: Subject to any disclaimer, the term of this patent is extended or adjusted under 35 U.S.C. 154(b) by 237 days.

(21) Appl. No.: 11/364,860

(22) Filed: Feb. 26, 2006

(65) Prior Publication Data

US 2006/0244942 A1 Nov. 2, 2006

Related U.S. Application Data

(60) Provisional application No. 60/657,354, filed on Feb. 27, 2005, provisional application No. 60/657,355, filed on Feb. 27, 2005, provisional application No. 60/774,834, filed on Feb. 18, 2006.

(51) Int. Cl.
*G03B 27/58* (2006.01)
(52) U.S. Cl. .............................. 355/72; 355/53; 355/75; 206/710
(58) Field of Classification Search .................. 355/53, 355/72, 75; 206/710; 430/5
See application file for complete search history.

(56) References Cited

U.S. PATENT DOCUMENTS

| | | | |
|---|---|---|---|
| 4,995,430 A | 2/1991 | Bonora et al. | |
| 5,024,329 A | 6/1991 | Grohrock | |
| 5,390,785 A * | 2/1995 | Garric et al. ............. | 206/213.1 |
| 5,434,748 A | 7/1995 | Fukui et al. | |
| 5,474,177 A | 12/1995 | Abrams et al. | |
| 5,482,161 A * | 1/1996 | Williams et al. ............ | 206/711 |
| 5,740,845 A | 4/1998 | Bonora et al. | |
| 5,785,186 A | 7/1998 | Babbs et al. | |
| 5,873,468 A * | 2/1999 | Ejima et al. ................. | 206/711 |
| 5,944,194 A | 8/1999 | Gregerson et al. | |
| 6,056,026 A | 5/2000 | Fosnight et al. | |
| 6,216,873 B1 | 4/2001 | Fosnight et al. | |
| 6,267,245 B1 | 7/2001 | Bores et al. | |
| 6,297,448 B1 | 10/2001 | Hara | |
| 6,319,297 B1 | 11/2001 | Fosnight | |
| 6,354,601 B1 * | 3/2002 | Krampotich et al. ........ | 277/628 |
| 6,513,654 B2 | 2/2003 | Smith et al. | |

(Continued)

*Primary Examiner*—Diane I Lee
*Assistant Examiner*—Steven H Whitesell-Gordon
(74) *Attorney, Agent, or Firm*—Patterson, Thuente, Skaar & Christensen, P.A.

(57) ABSTRACT

The present invention is a pod for containing a particulate sensitive substrate and for providing pressure equalization between the exterior and an interior environment of the pod and for minimizing gaseous fluid flow inside adjacent to the particulate sensitive substrate. The pod comprises a primary pod, a diaphragm positioned in a cover, the diaphragm having a normal undeflected position, the diaphragm deflectable from the normal undeflected position. Preferably, the pod comprises a secondary pod disposed in the primary pod defining a second enclosure for containing the particulate sensitive substrate. The pod may comprise a filter attached to the pod and providing gaseous fluid communication between the exterior of the pod and the interior of the pod. The diaphragm is responsive to rapid pressure changes and the filter is responsive to slower pressure changes and allows the diaphragm to return to its normal undeflected position.

12 Claims, 13 Drawing Sheets

U.S. PATENT DOCUMENTS

| | | |
|---|---|---|
| 6,736,268 B2 | 5/2004 | Nyseth et al. |
| 6,758,876 B2 | 7/2004 | Suzuki et al. |
| 6,808,352 B2 | 10/2004 | Seita |
| 6,906,783 B2 | 6/2005 | del Puerto et al. |
| 2003/0227605 A1 | 12/2003 | del Puerto et al. |
| 2004/0025691 A1 | 2/2004 | Vanderhoof et al. |
| 2004/0207828 A1 | 10/2004 | Miyajima |

* cited by examiner

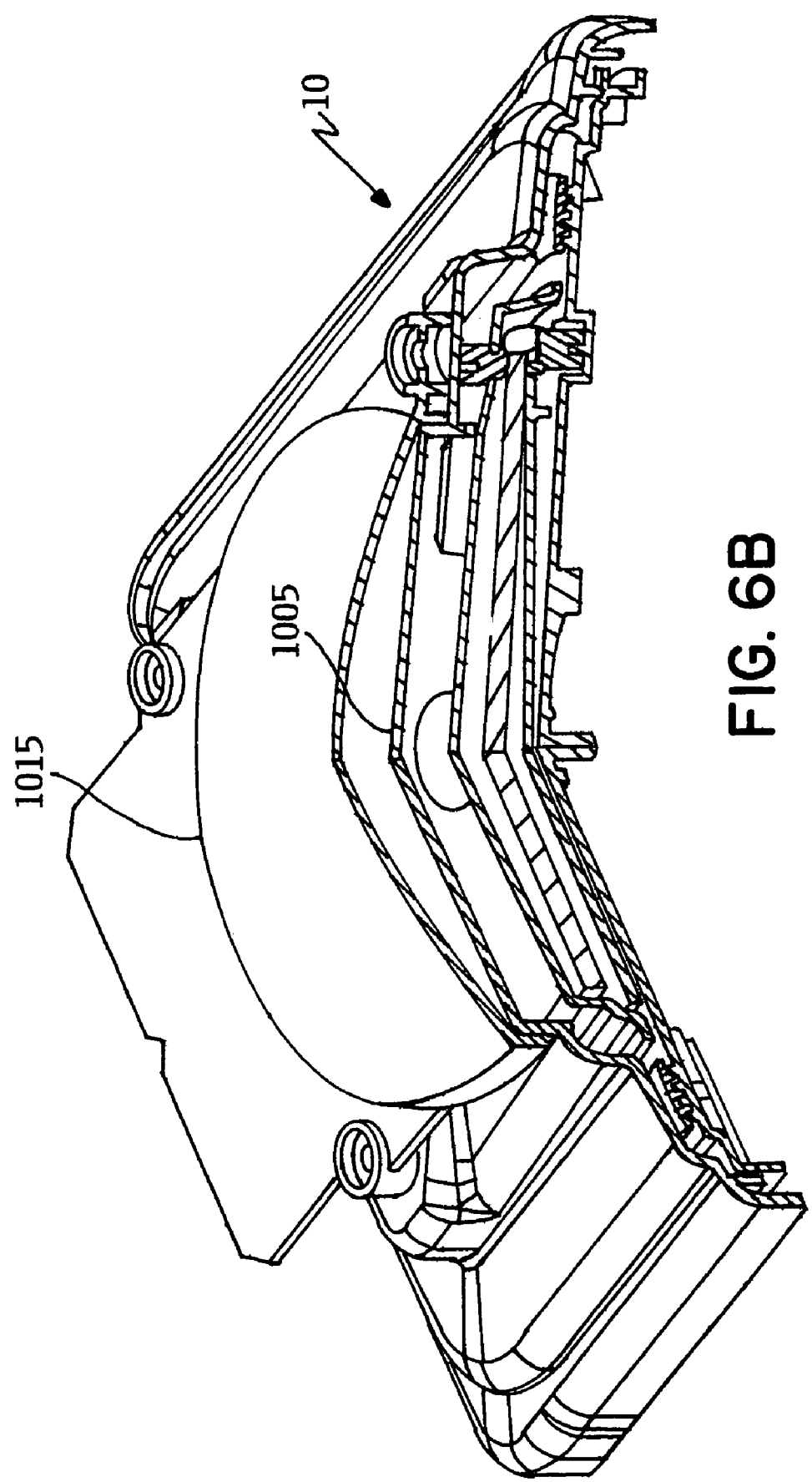

SUBSTRATE CONTAINER WITH PRESSURE EQUALIZATION

RELATED APPLICATIONS

The present application claims the benefit of U.S. Provisional Application Ser. No. 60/657,354, filed Feb. 27, 2005, U.S. Provisional Application Ser. No. 60/657,355, filed Feb. 27, 2005, and U.S. Provisional Application Ser. No. 60/774,834, filed Feb. 18, 2006, which are included herein in their entirety by reference.

FIELD OF THE INVENTION

The invention relates to substrate carriers with particle contamination control used in semiconductor manufacturing and more particularly to transportable and shippable reticle carriers that are provided with a pressure equalization system within the controlled environment surrounding the substrate within the carrier.

BACKGROUND OF THE INVENTION

Photolithography is one of the process steps commonly encountered in the processing of silicon wafers for semiconductor applications. In photolithography, a wafer surface with a deposit of silicon nitride is coated over with a light-sensitive liquid polymer or photoresist and then selectively exposed to a source of radiation using a template with a desired pattern. Typically, ultraviolet light is shone through or reflected off a surface of a mask or reticle to project the desired pattern onto the photoresist covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. Typically, the wafer is subjected to an etch process that removes the exposed portion of the nitride layer leaving a nitride pattern on the wafer in the exact design of the mask.

The industry trend is towards the production of chips that are smaller and/or with a higher logic density necessitating smaller and smaller line widths on larger wafers. Clearly, the degree of fineness to which the surface of the reticle can be patterned, and the degree to which this pattern can be faithfully replicated onto the wafer surface, are factors that impact the quality of the ultimate semiconductor product. The resolution with which the pattern can be reproduced on the wafer surface depends on the wavelength of ultraviolet light used to project the pattern onto the surface of the photoresist-coated wafer. State-of-the-art photolithography tools use deep ultraviolet light with wavelengths of 193 nm, which allow minimum feature sizes on the order of 100 nm. Tools currently being developed use 157 nm Extreme Ultraviolet (EUV) light to permit resolution of features at sizes below 70 nm.

The reticle is a very flat glass plate that contains the patterns to be reproduced on the wafer. Typical reticle substrate material is quartz. Because of the tiny size of the critical elements of modern integrated circuits, it is essential that the operative surface of the reticle (i.e. the patterned surface) be kept free of contaminants that could either damage the surface or distort the image projected onto the photoresist layer during processing thereby leading to a final product of unacceptable quality. Typically, the critical particle sizes are 0.1 µm and 0.03 µm for the non-patterned and patterned surfaces respectively when EUV is part of the photolithography process. Typically, the patterned surface of the reticle is coated with a thin, optically transparent film, typically of nitrocellulose, attached to and supported by a frame, and attached to the reticle. Its purpose is to seal out contaminants and reduce printed defects potentially caused by such contaminants migrating to the image plane. However, extreme EUV utilizes reflection from the patterned surface as opposed to transmission through the reticle characteristic of deep ultraviolet light photolithography. Currently, the art does not provide pellicle materials that are transparent to EUV. Consequently, the reflective photomask (reticle) employed in EUV photolithography is susceptible to contamination and damage to a far greater degree than reticles used in conventional photolithography. This situation imposes heightened functional requirements on any container designed to receive, store, transport and ship a reticle destined for EUV photolithography use.

Clearly, unnecessary and unintended contact with other surfaces during manufacturing, processing, shipping, handling, transport or storage is highly undesirable in view of the susceptibility of the delicate features on the patterned surface of the reticle to damage due to sliding friction and abrasion. Secondly, any particulate contamination of the surface of the reticle will likely compromise the reticle to a degree sufficient to seriously affect any end product obtained from the use of such a reticle during processing. Particles can be generated within the controlled environment containing the reticle during processing, transport and shipping. Sliding friction and consequent abrasion is one source of contaminating particulates. A reticle sliding from its desired position in a reticle container during transport, for example, is another source of particulates. Such an out-of-position reticle will also likely be misaligned when automatically retrieved from the container and positioned into processing equipment potentially leading to an end product that is of unpredictable quality. Sliding contact during placement and removal of a reticle from the container to the lithography equipment also creates opportunities for particulate generation and contamination. Finally, shock and vibration of the container can be transmitted to the reticle and components holding the reticle causing friction and associated particle generation.

Conventionally, reticles are shipped to the fabrication facility in which they are used in one container and are stored in the fabrication facility in between uses in other containers. The shipping containing is typically discarded after use. The transfer of the reticles from the shipping containers to the containers in which they are stored within the fabrication facility creates another opportunity for contamination. Conventional requirements for shippers for reticles and containers for use within the fabrication facility are dramatically different. Combining the container for both uses would eliminate the opportunity of incursion and generation of particulates during the transfer from the shipper container to the fabrication facility use container but presents significant design challenges. For example the container would need to be able to handle the potential dramatic changes in atmospheric pressure during transportation, such as associated with altitude and temperature changes. Also shock absorption capabilities in transportation are much more demanding than in the controlled robotic transfers occurring in fabrication facilities.

Some of the considerations discussed above are also applicable to semiconductor wafer substrates. Recognizing the need for a controlled environment around the wafer, especially during storage, processing and transport, prior art has evolved approaches to isolation technology that allows for control of the environment in the immediate vicinity of a wafer by providing for a container to house the wafer so that it can be kept relatively free from incursion of particulate matter.

Wafers are typically shipped to a fabrication facility in a shipping container and then transferred to a separate container for storing the wafers in between processing steps in the fabrication facility. 200 mm wafers are typically shipped in sealed plastic "shippers" either edge supported in a spaced array or stacked vertically with sheet material spacers in "coin stack wafer shippers" Industry standardized containers for holding 200 mm wafers in between processing steps in fabrication facilities are known as standard mechanical interface pods, or SMIF pods and having bottom opening doors. For 300 mm wafers, the shippers are known as front opening shipping boxes, or FOSBS, and the containers for holding the wafer in between process steps are known as front opening unified pods, or FOUPS. Reticles stored in Fabrication facilities in between fabrication steps now often are stored in bottom opening containers similar to the standardized SMIF pods and are termed reticle SMIP pods, or RSPs.

Even when substrates, that is wafers and reticles, are in such a controlled environments, particulates that may be present inside the controlled environment can migrate due to pressure changes of the air trapped in the controlled environment or turbulence of the trapped air brought on by rapid movements of the container and/or by disturbing the trapped air volume, such as by simply opening and closing the container. Also, thin walled shippers or FOSBS may experience wall movement due to altitude related pressure changes causing the trapped air inside the controlled environment to be displaced. Temperature changes can set up convection currents within the container. Dimensional changes of the container and its components can compromise the functioning of the support and retaining mechanisms leading to wafer misalignment and/or warping of the substrate carried within the container. Dimensional changes of the container wall due to pressure fluctuations can compromise the sealing between the cover and the door of the carrier allowing particulate incursion within the carrier.

Prior art approaches, particularly in wafer containers, utilize a breathing apparatus between the external environment and the internal controlled volume of air. The breathing apparatus provides a path for the air to flow. A filter interposed in the path is expected to provide a barrier to incursion of particulates from the external environment into the controlled environment of the carrier. However, as noted above, the reticle used in a EUV photolithography process has very fine and delicate features so the critical particle sizes are only of the order of 0.1 μm and 0.03 μm for the non-patterned and patterned surfaces of the reticle respectively. At such low particle sizes, a filter would require a very fine pore size causing a considerable resistance to fluid flow across it thereby necessitating a larger filter surface area. The alternative to a larger filter surface area is a slower response to sudden pressure changes such as those encountered in shipping the container. Both of these are not desirable alternatives because one of the objectives of reticle SMIF pod design is to keep the controlled volume to a minimal so it can be effectively sealed against incursion of particulates. Minimizing the controlled volume within which the reticle is positioned whilst providing for a large filter area to achieve pressure equalization within the controlled volume are incompatible objectives.

It is desirable that particulates that are generated or are otherwise introduced or present within the controlled environment are prevented from settling on the reticle. In this regard, it is preferable to have a minimal volume for the environment within which the reticle is carried and which has to be controlled to avoid particulate contamination. It is also desirable that the air in the controlled volume remains relatively static. For example, the deflection of a wall of the container in response to large and sudden pressure differences can induce a pressure wave inside the controlled volume forcing particulates into suspension and subsequent migration.

What is needed is a substrate container suitable for use both as a shipper and to store the substrates in between processing steps in the fabrication facilities. What is needed is a container that provides improved resistance to particulate generation and minimization of particle disruption or movement within a substrate container during transportation, and opening and closing of the container. What is needed is a pressure equalization system that effectively equalizes pressure between an internal controlled environment of the carrier and the air external to the carrier without incursion or excursion of air from the controlled environment and with minimal turbulence of the air already present within the controlled environment.

SUMMARY OF THE INVENTION

The present invention is a pod for containing a particulate sensitive substrate and for providing pressure equalization between the exterior and an interior environment of the pod and for minimizing gaseous fluid flow inside adjacent to the particulate sensitive substrate. The pod comprises a primary pod including a base and a cover, the cover configured with a concave inner surface opposite an outer surface, the cover adapted to removably engage the base to define a first enclosure having a first volume between the concave inner surface and the base, the cover having an aperture. The pod also comprises a diaphragm positioned in the cover, the diaphragm having a normal undeflected position, the diaphragm dividing the first volume between a second volume in communication with the exterior of the pod, and a third volume not in fluid communication with the exterior of the pod, the diaphragm deflectable from the normal undeflected position. Finally, the pod comprises a secondary pod disposed in the primary pod, the secondary pod comprising a lower portion and an upper portion, the upper portion adapted to interface with the lower portion to define a second enclosure characterized by a second enclosure volume for containing the particulate sensitive substrate, the lower portion comprising support structure to removably hold the particulate sensitive substrate thereupon and the upper portion comprising retaining structure for retaining the particulate sensitive substrate when the upper portion is engaged with the lower portion.

In an exemplary embodiment, the diaphragm is substantially concentrically positioned with respect to the particulate sensitive substrate therein. At least a part of the operative portion is provided with a structure of concentric ridges. In another embodiment, the diaphragm comprises an operative portion movable from the normal undeflected position to deflected positions. In a secondary embodiment, the operative portion includes a first portion and a second portion, said first portion being gaseous fluid impermeable and said second portion being gaseous fluid permeable.

In a secondary embodiment, the pod may comprise a filter attached to the pod and providing gaseous fluid communication between the exterior of the pod and the interior of the pod. The pod of claim 1 wherein the diaphragm has an operative portion at least a part of the operative portion is provided with a structure of concentric ridges.

In the preferred embodiment, the diaphragm is formed of an elastomeric material. Another embodiment envisages the cover being provided with a domed wall and a primary pod positioned within a secondary pod all concentrically positioned with the diaphragm. The secondary pod is configured to provide a barrier to particulate entry by way of a restriction having an air gap. In a tertiary embodiment, the primary pod is provided with an elastomeric seal.

It is a feature and advantage of preferred embodiments of the invention to provide rapid response pressure equalization that is particularly advantageous for utilizing the pod as both a shipping device and a device for storing the reticle (or wafers) within the fabrication facility particularly intermediate processing steps.

It is a feature and advantage of preferred embodiments of the invention to provide a reticle SMIF pod that is particularly suitable for use with EUV lithography techniques.

BRIEF DESCRIPTION OF THE DRAWINGS

FIG. 6B is a perspective sectional view of an assembled container according to the alternate embodiment of the present invention.

DETAILED DESCRIPTION OF THE INVENTION

The invention herein will be described primarily with reference to a reticle SMIF pod but the invention is also applicable to FOUPS, FOSBS, wafer SMIF pods, and other controlled environment containers used in the semiconductor processing industry or other similar industries. Referring to FIGS. 1-5, a reticle container 10 (alternatively referred to as a reticle "pod") generally includes a cover 14 capable of sealingly mating with a base (alternately referred to as a "door") 18 to enclose a hermetically sealed environment 22 within reticle container 10 for storing, transporting and shipping a reticle 26. Reticle 26, which may come in various sizes, including 5", 6", 7", 8", 150 mm and 200 mm diameter reticles, is located within this sealed environment 22, and is effectively isolated from particulate contaminants that may be present external to reticle container 10.

Figure 6A:
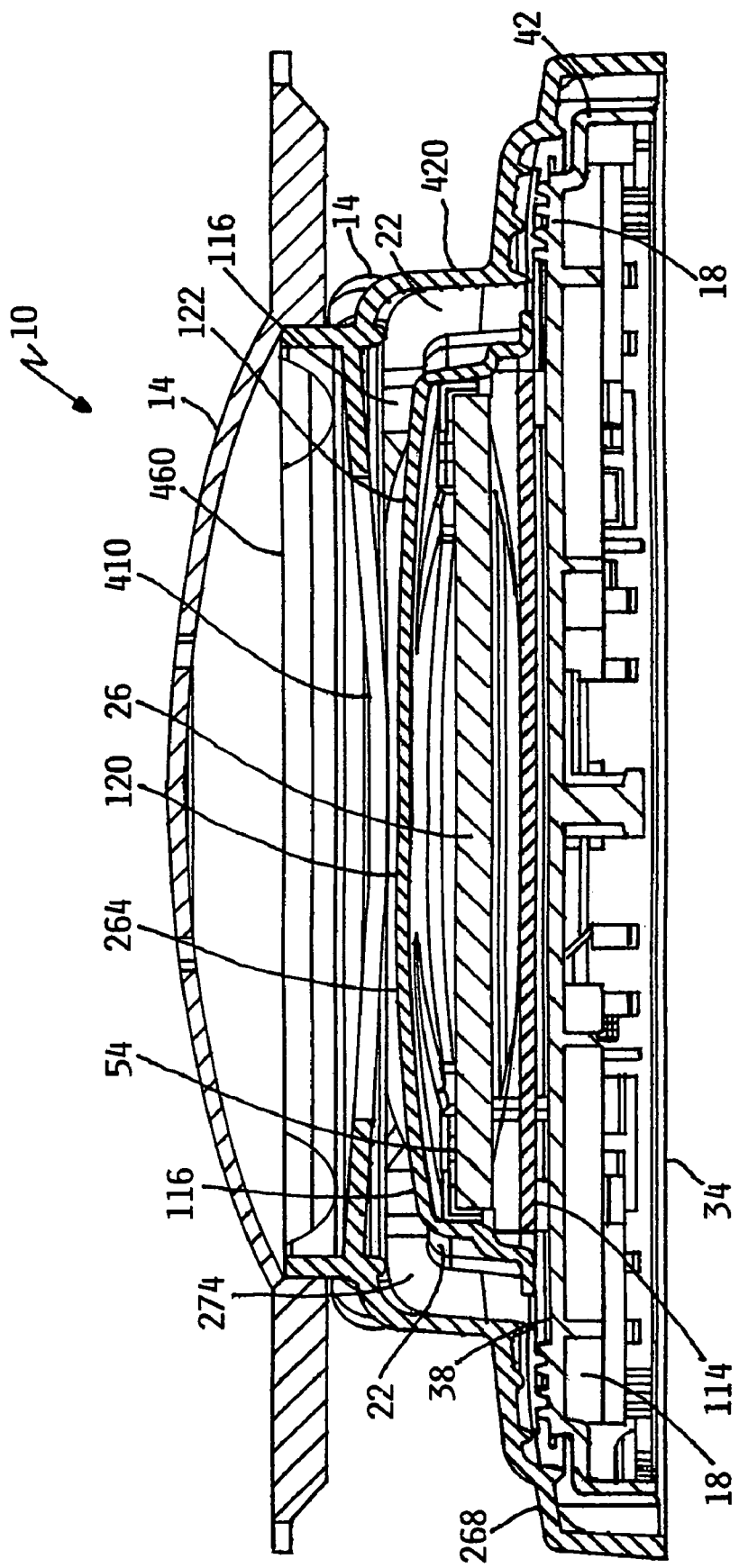
FIG. 6A is a sectional side view of an assembled container according to an alternate embodiment of the present invention.

The base 18 is provided with features to comply with Semiconductor Equipment and Materials International (SEMI) standards for automated use with various types of wafer-fabrication equipment. In an exemplary embodiment, base 18 is at least partially compliant with similar bases on Reticle "SMIF" (Standard Mechanical Interface) pods used with microlithography systems well-known in the art. For example, as illustrated in FIG. 6a, the base 18 has a lower-surface 30 (not shown) defined by a periphery 34 and having footprint of area 36 (not shown) opposite an upper-surface 38 spaced from said lower surface 30 by lateral surface 42. The lower surface 30 is provided with features in accordance with SMIF standards so as to be compatible with semiconductor processing equipment (not shown). The SMIF compliant base 18 is also adapted to be removably coupled to the cover 14 by means of a base-latch mechanism (not shown) capable of being opened by a SEMI conformable latch opening device (not shown). See U.S. Pat. No. 4,995,430 owned by the owner of the instant application and incorporated herein by reference. The container elements are preferably formed of a durable polymer by a process of injection molding or other suitable manufacturing process. The polymer can be clear to allow the viewing of reticle 26. The elements may additionally be static dissipative. An example of a transparent, static dissipative material, from which the pod elements may be formed is polymethyl methacrylate. The pod elements may alternatively be formed of static dissipative, carbon fiber-filled polycarbonate, which is opaque, and include transparent window(s) (not shown), through which reticle 26 may be viewed. As a further alternative, they may be formed of clear polycarbonate. As an alternative to polycarbonate, the elements may further be formed of flame retardant polyetherimide. It is understood that the pod elements may be formed of other materials in alternative embodiments. They are preferably formed by injection molding, but other known methods of manufacture are also contemplated. An exemplary reticle SMIF pod is described in U.S. Pat. No. 6,216,873 to Asyst Technologies Inc., the contents of which are incorporated herein by reference. Use of SMIF reticle pods in EUV applications is disclosed in U.S. Pat. No. 6,906,783 which is incorporated by reference herein.

Generally, reticle 26 has a first surface 54 and a patterned surface 58. As described in the background section above, the patterned surface has very fine features and therefore cannot be brought into contact with other surfaces, such as the surfaces of reticle container 10. Typically, reticle 26 is supported at peripheral portions of the reticle surfaces 54 and 58 that are pattern free and thus less susceptible to damage upon contact with reticle support structures. Reticle container 10 includes reticle support mechanism 100 and reticle retainer mechanism 104 mounted on base 18 and on cover 14 respectively within sealed environment 22. FIGS. 6a and 6b show a front sectional view and perspective sectional view, respectively, of the reticle container 10. In an exemplary embodiment, the cover 14 and base 18 are generally rectangular with reticle 26 supported in a plane substantially normal to lateral surface 42 on spaced apart reticle support pads 218 located on reticle support frame 200 and a reticle retainer frame 208. Reticle support frame 200 and reticle retainer frame 208 are in turn operably coupled to resilient support posts 110 and opposed resilient retainer posts 112 extending from and attached to base 18 and cover 14 respectively. Both, the support and retainer posts are adapted to have low stiffness in an axial (z-direction) and lateral, i.e. in the x- and/or y-direction, so as to deform and deflect in response to any shock and vibration loading in those directions. Reticle retainer posts 112 are adapted to cooperate with reticle support posts 110 so that when cover 14 is mated with base 18, reticle retainer posts 112 and reticle support posts 110 deform in the z-direction to maintain a continuous bias on surfaces 54 and 58 of reticle 26 to retain the reticle 26 in a desired position sandwiched between cover 14 and base 18. One of skill in the art will appreciate that the arrangement of reticle support posts 110 and reticle retainer posts 112 will reduce the effect of vibration of the mounting base, i.e. base 18 and/or cover 14, on reticle 26.

Reticle support frame 200 and reticle retainer frame 208 may be formed of a substantially rigid, electrostatically dissipative, non-particulating material such as for example carbon fiber-filled polyetheretherkeytone ("PEEK"). When reticle container 10 encounters vibration or shock loading tending to deflect the resilient support posts 110 and the resilient retainer posts 112, the rigid reticle support frame 200 and reticle retainer frame 208 move as a substantially rigid body acting to constrain the deflections of the support posts and retainer posts and providing mass damping so that the reticle 26 is always maintained in the desired configuration within reticle container 10. In an alternate embodiment, reticle retainer frame 208 mates with reticle support frame 200 to form a secondary pod 400 with a secondary environment 405 within primary hermetically sealed environment 22 formed by mating cover 14 with base 18. Secondary environment 405 is in fluid communication with hermetically sealed environment 22 but the air contained within secondary environment 405 is relatively less susceptible to turbulence because of the smaller volume of air involved and the tortuous fluid flow path between sealed environment 22 and secondary environment 405.

Figure 7A:
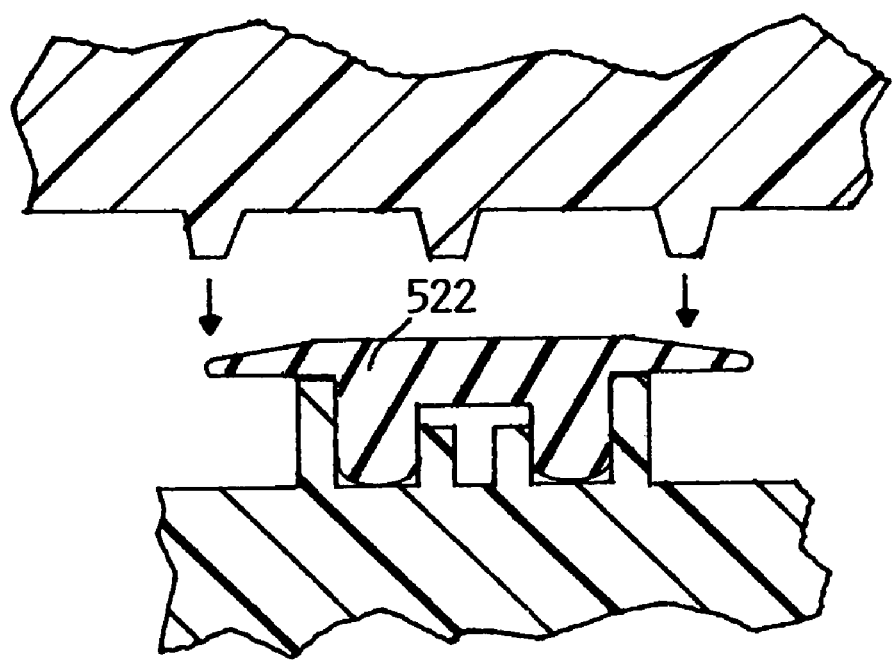
FIG. 7A is an illustration of an exemplary seal in an undeformed configuration according to the present invention.
Figure 7B:
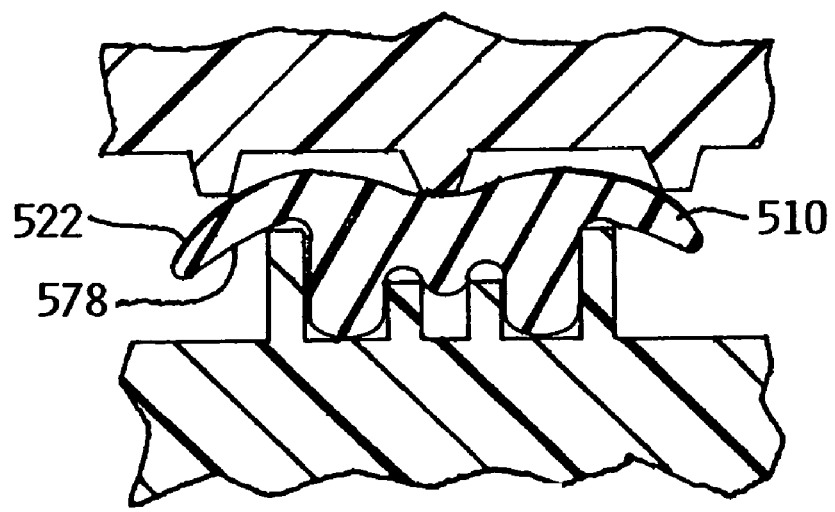
FIG. 7B is an illustration of a deformed configuration of the exemplary seal of FIG. 7A.
Figure 8A:
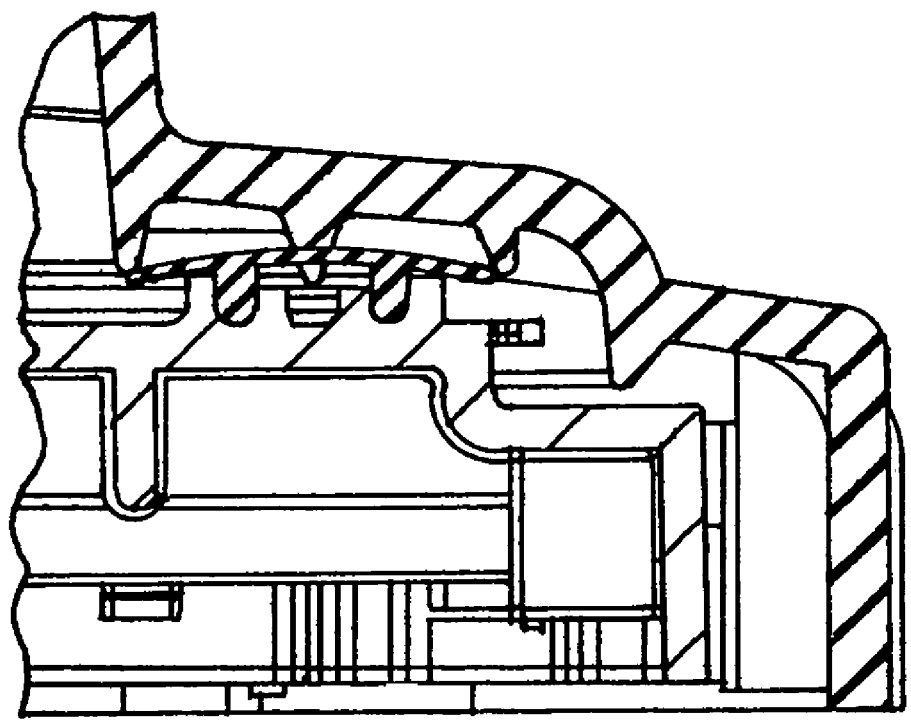
FIG. 8A is a detailed sectional view illustrating an engagement between the cover and the base according to an alternate embodiment of the present invention.
Figure 8B:
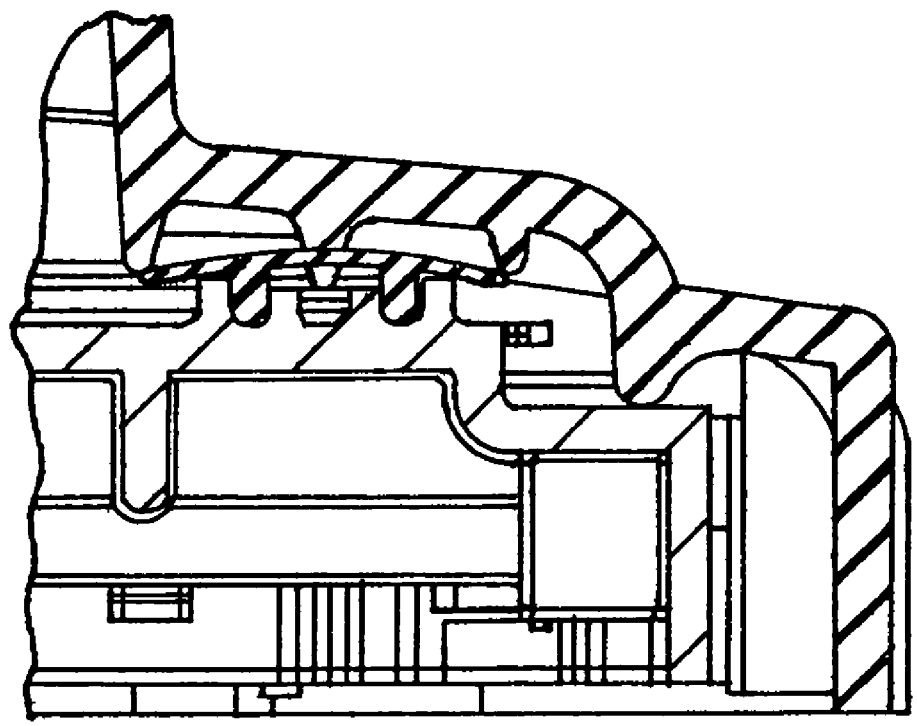
FIG. 8B is a detailed sectional view illustrating an engagement between the cover and the base showing the cover contacting the base according to the primary embodiment of the present invention.

In one embodiment of cover 14 and base 18, peripheral edge 428 of cover 14 is located circumjacent lateral surface 42 of base 18 such that the base 18 is entirely contained within cavity 432. Additionally, an elastomeric seal 510 as shown in FIGS. 7a and 7b is provided on base 18. Seal 510 comprises a strip of elastomeric material 514 having a lower sealing surface 518 and an upper sealing surface 522. Elastomeric fingers 528 extend from lower surface 518. Fingers 528 are sized to be press-fittingly received within circumferential "U" shaped grooves 532 formed on upper surface of base 18. As illustrated in FIGS. 8a and 8b, when fully positioned into grooves 532, seal 510 is located with lower sealing surface 518 facing upper surface 38 of base 18. Grooves 532 extend concentrically around proximally to point of contact 536 of reticle retainer frame 208 on upper surface 38. Inner surface 436 of cover 14 is provided with a plurality of spaced, substantially parallel edges 548 that circumnavigate a region of the inner surface 36 and have a "V" shaped cross-sectional profile. Edges 548 are sized and located so as to make contact with upper sealing surface 522 elastomeric seal 510 so as to enclose a plurality of air pockets 568 and thereby provide a seal barrier between the external environment and sealed, controlled environment 22. The multiple seal engagements and air pockets 568 constitute a high resistance to flow between controlled environment 22 and the external environment. The functioning of the elastomeric seal and resilient support of the secondary pod is best understood with reference to companion application "Shock and Vibration Isolation System For a Reticle Pod", filed concurrently, and with inventors: Gregerson, Halbmaier, Sumner, Wiseman, Tieben, and Strike; the contents of said application is incorporated herein by reference.

In an exemplary embodiment shown in FIGS. 7a and 7b, seal 510 is shaped substantially like the Greek letter Π when undeformed. Fingers 528 of Π-shaped elastomeric seal 510 are received within grooves 532. Three parallel edges 547, 548, and 549 are provided spaced apart such that when cover 14 is mated with base 18, parallel edge 549 contacts the top of diaphragm 510 in the region between fingers of the Π and parallel edges 547 and 549 contact seal 510 proximate its extremities. This arrangement keeps seal 510 in contact with both surfaces of cover 14 and base 18 as long as cover 14 and base 18 are mated together. When base 18 is retrieved, seal 510 "springs" back from maximum contact with base 18 thereby avoiding particulate formation that would occur if diaphragm 510 stuck to base 18.

Seal 510 may be a solid or hollow member having a shape such as illustrated in FIGS. 7a and 7b. It may be made of a non-sticky material such as silicone rubber, vinyl chloride resin or other suitable synthetic resin known in the art.

As seen in FIGS. 1, 2, 4, 5A, 6A and 6B cover 14 includes a canopy 410, side walls 420 extending circumferentially from said canopy 410 to terminate in a peripheral edge 428 removed from said top wall to define a cavity 432 with an internal surface 436. As described above, mating cover 14 with base 18 creates a hermetically sealed controlled environment 22 between the inner surface 436 of cover 14 and upper surface 38 of base 18 with the peripheral edge 428 circumjacent lateral surface 42 of base 18 and with base 18 contained within cavity 432.

Figure 1:
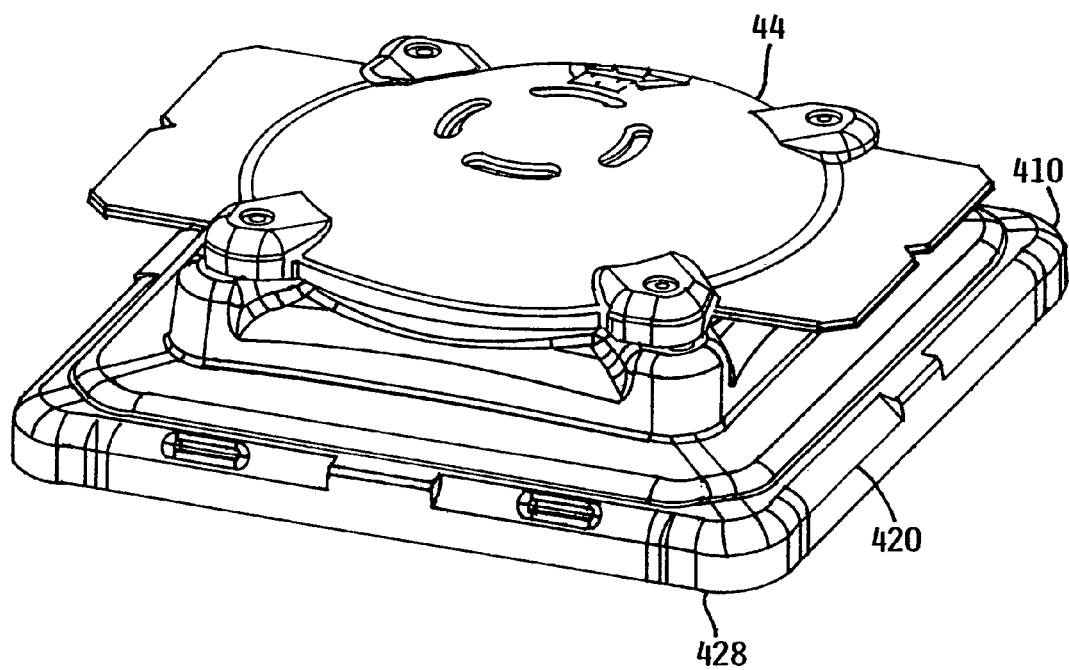
FIG. 1 is a perspective view of a cover according to a primary embodiment of the present invention.
Figure 2:
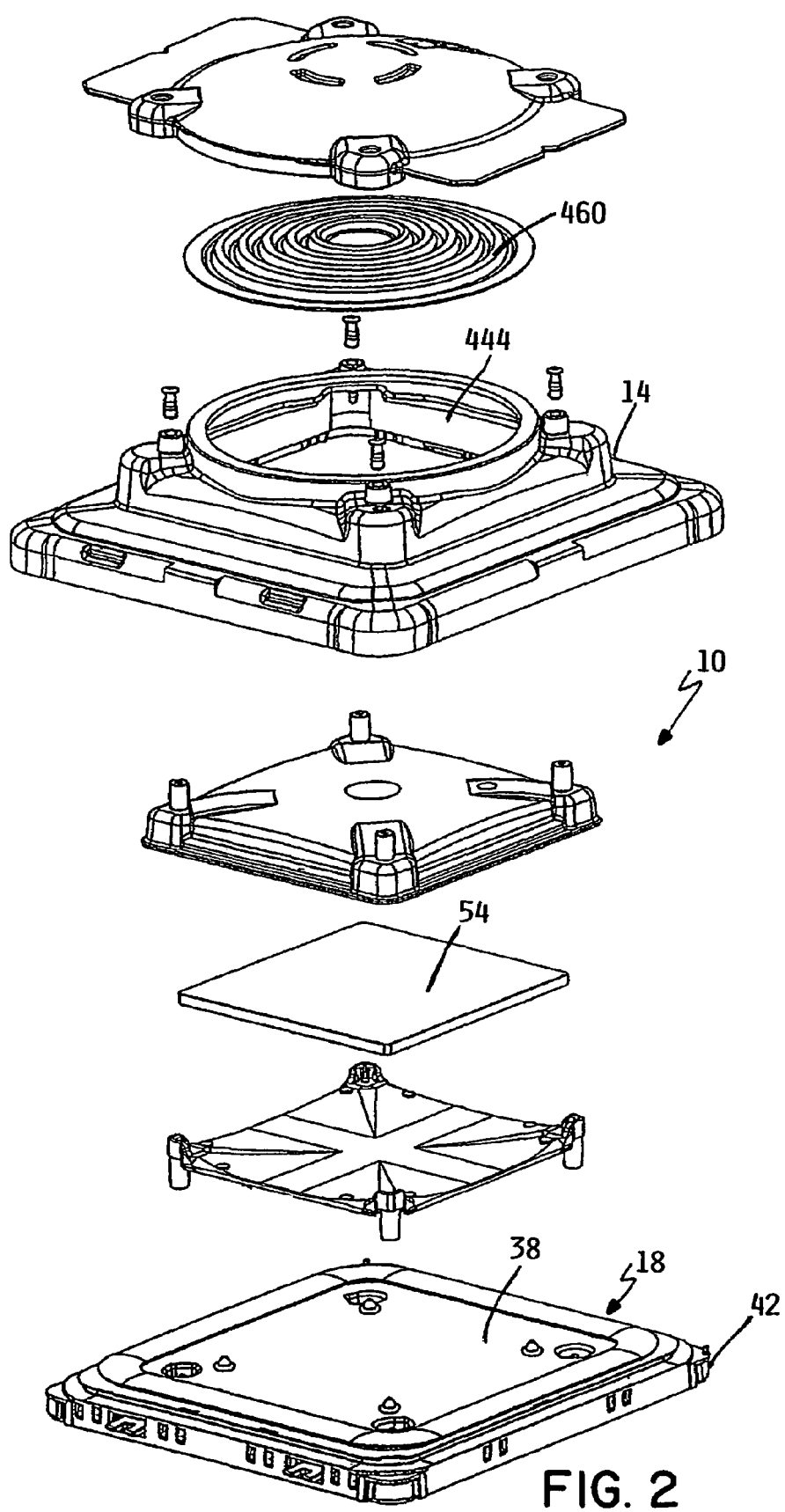
FIG. 2 is an exploded view of an assembly of the container according to an exemplary embodiment of the present invention.
Figure 3:
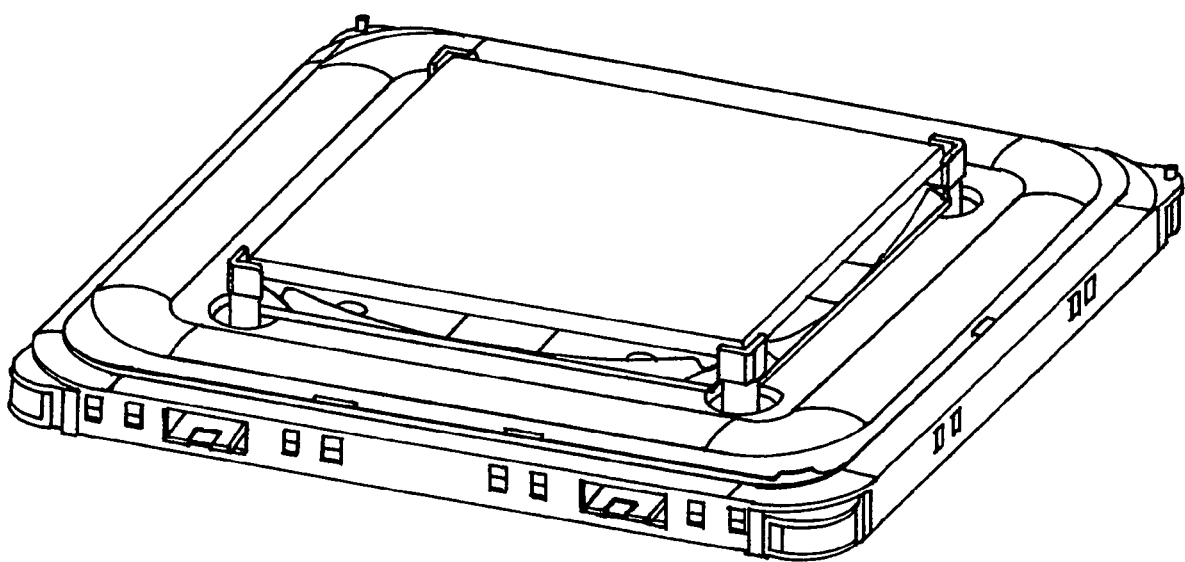
FIG. 3 is a perspective view of a base and a substrate supported on the base according to the primary embodiment of the present invention.
Figure 4:
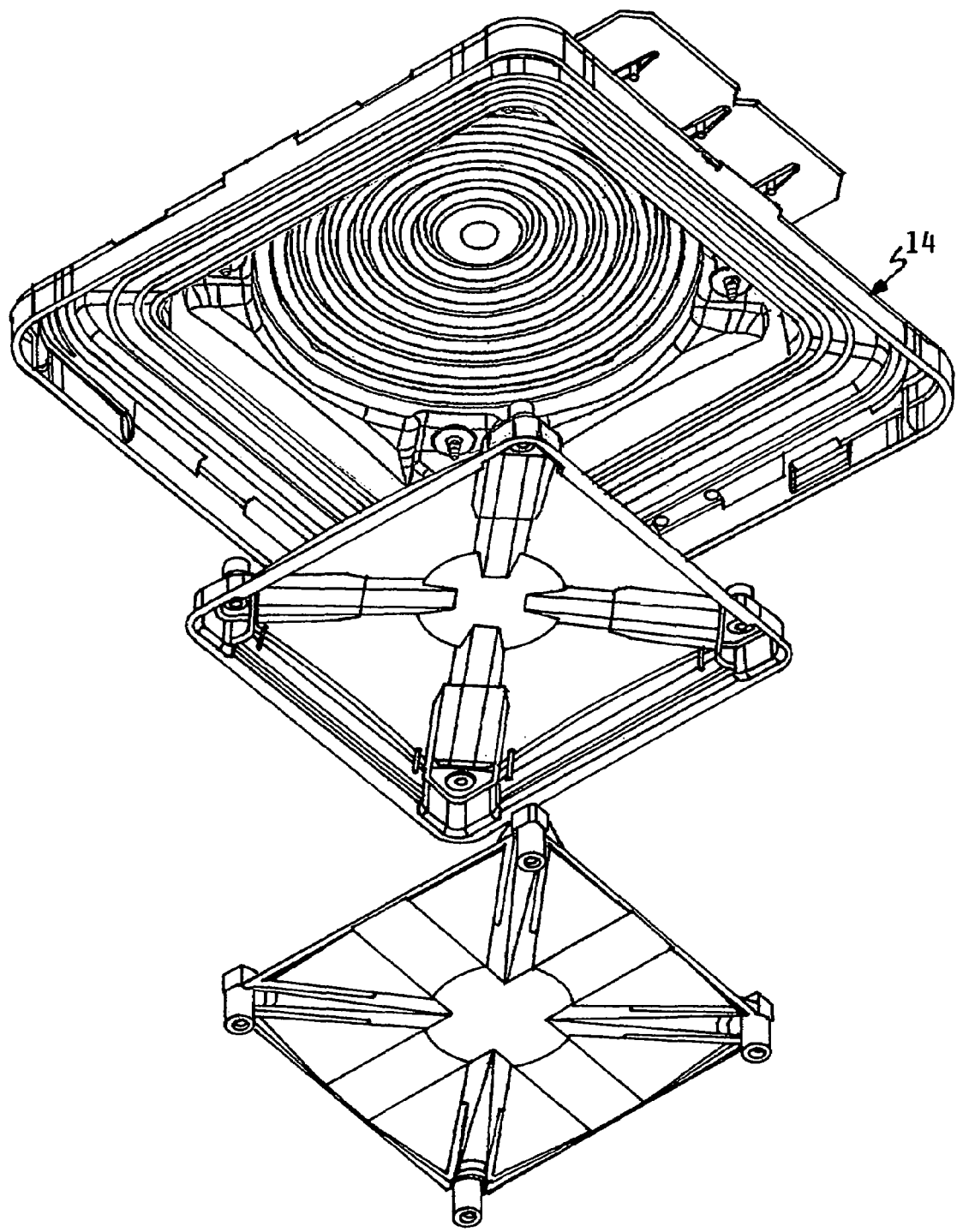
FIG. 4 is a perspective view looking upward of the cover and components of a secondary pod according to an exemplary embodiment of the present invention.

Canopy 410 further comprises a structure defining a vent 444 for communicating controlled environment 22 within the reticle container 10 to the exterior of the reticle container 10. The vent hole 444 is surrounded by an annular mounting flange 448 with outer circumferential wall 452 rising from the canopy 410 and away from reticle container 10 to terminate at a top end surface 456. A flexible diaphragm cap 460 is slidably received and circumjacently positioned about outer circumferential wall 452 so as to extend over vent 444. A flexible diaphragm 470, shown in FIG. 3, is attached and sealed to top surface 456, sandwiched between top surface 456 and vented diaphragm cap 460 by suitable fastening and retaining means. The flexible diaphragm 470 is dish-shaped with circumferential ridges to provide structural rigidity and a circumferential groove 474 at its periphery proximate surface 456 adapted to sealingly contact the diaphragm with appropriate fastening and retaining means. The diaphragm separates the controlled environment 22 from the environment external to reticle container 10. A change in pressure, without or within the controlled environment 22 is equilibrated by a movement of the diaphragm to change the volume of controlled environment 22 such that a functional relationship between a pressure inside controlled environment 22 and a volume of controlled environment 22 are maintained substantially constant.

Figure 5A:
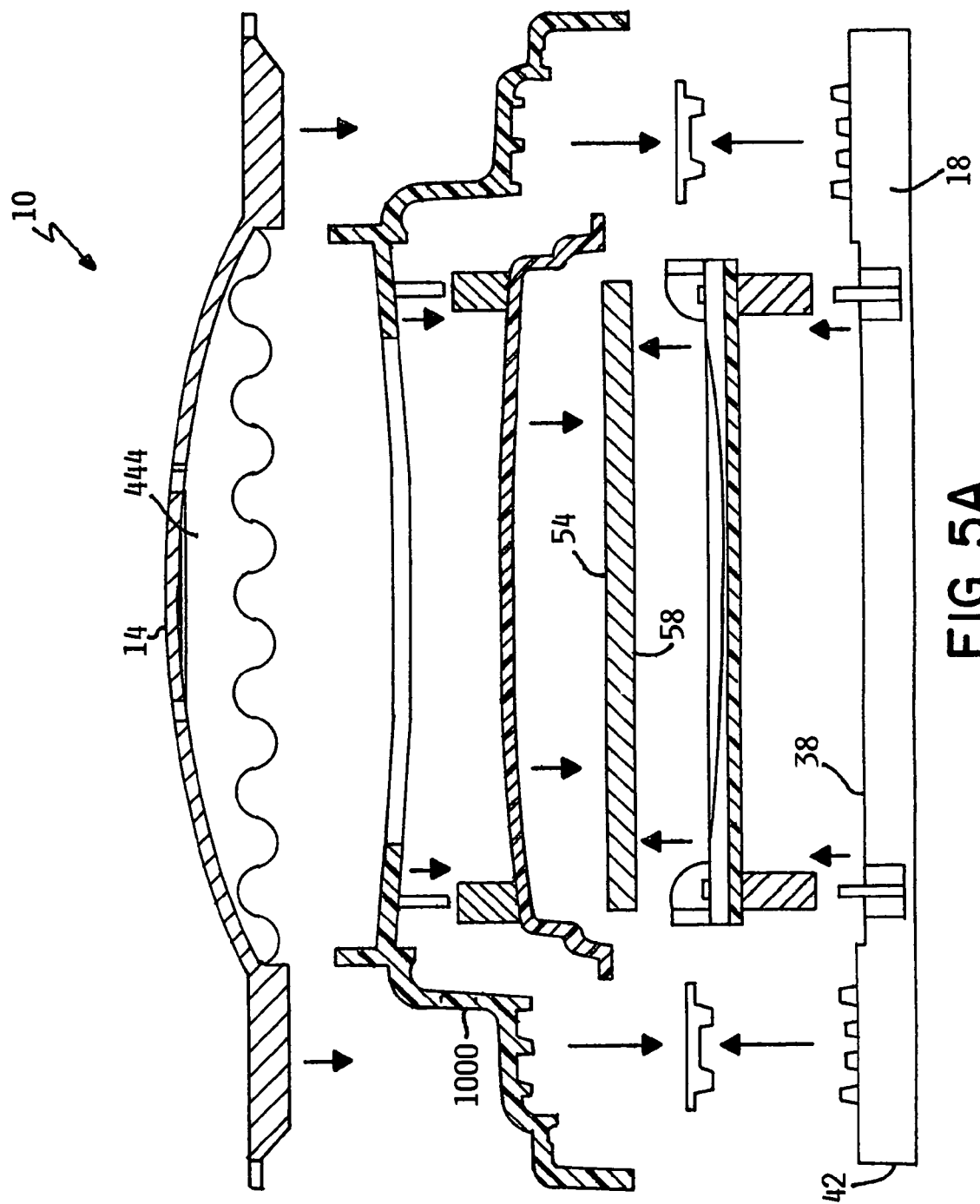
FIG. 5A is an exploded sectional side view of an assembly of the container including the components of the isolation system according to the primary embodiment of the present invention.
Figure 5B:
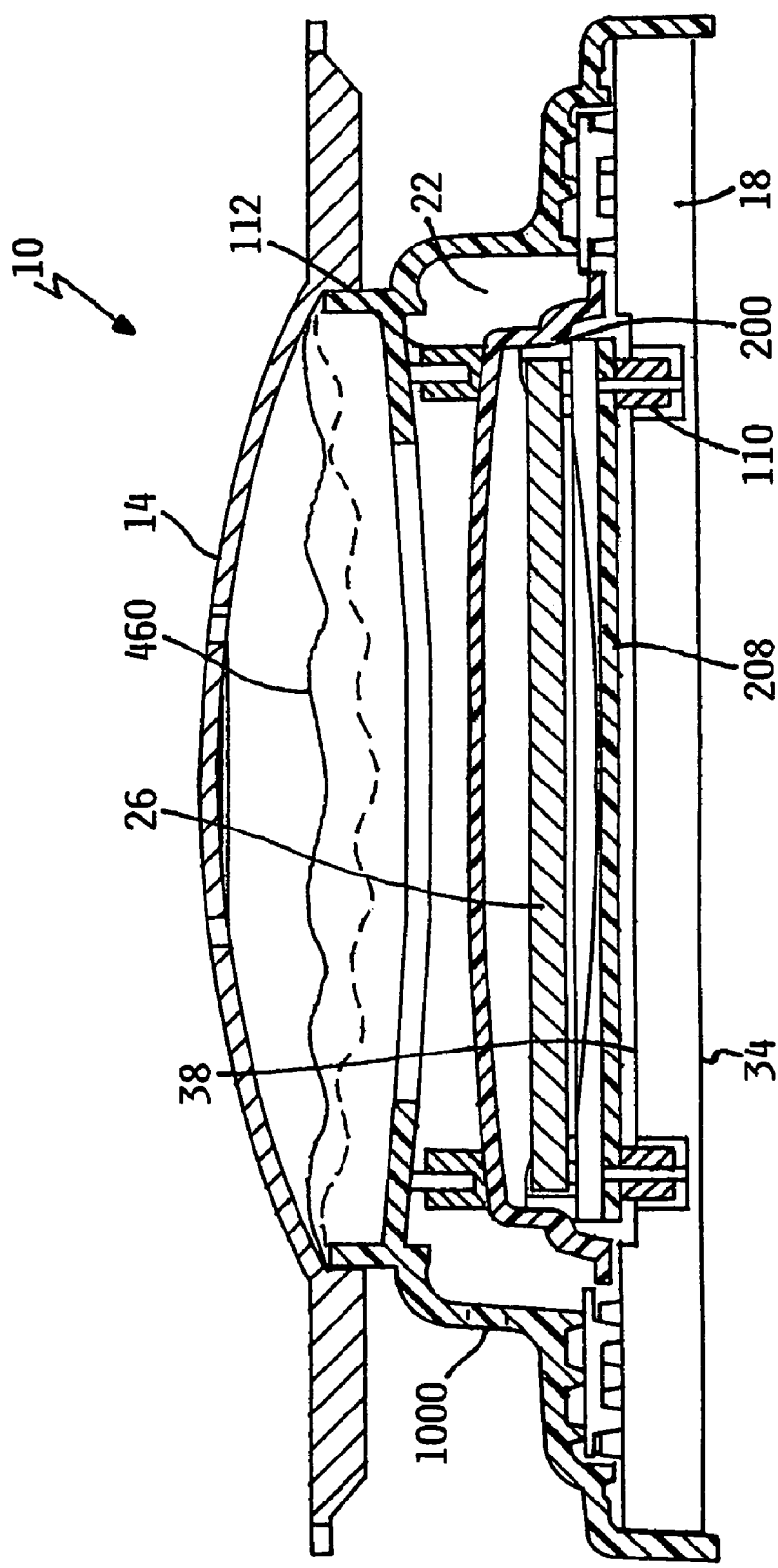
FIG. 5B is a sectional side view of an assembled container according to one embodiment of the present invention.
Figure 9:
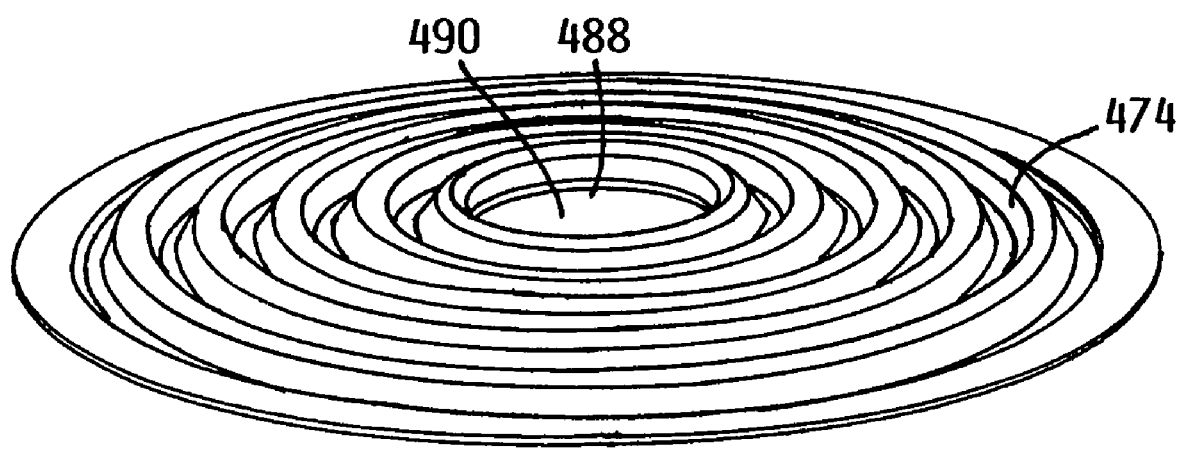
FIG. 9 is an illustration of a diaphragm according to a secondary embodiment of the present invention.
Figure 10:
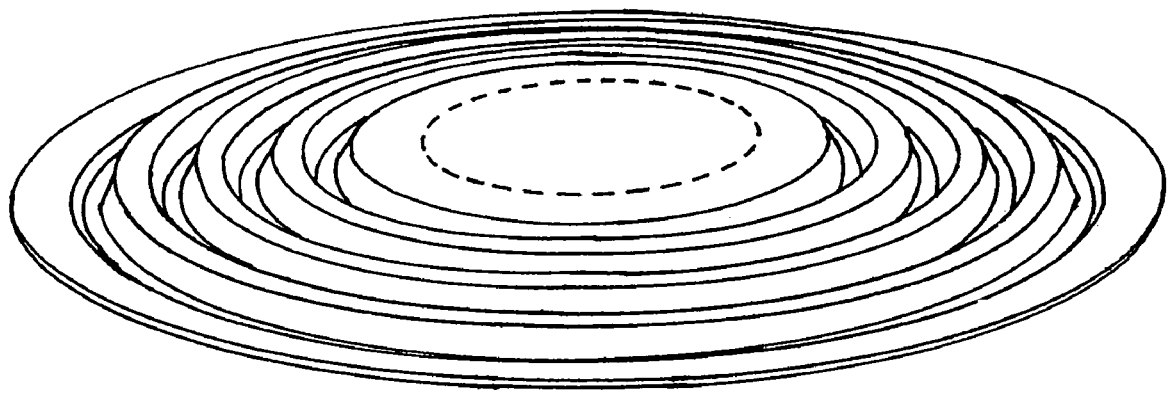
FIG. 10 is an illustration of a diaphragm according to a secondary embodiment of the present invention

It will be appreciated by one of skill in the art that a sudden, large pressure differential between controlled environment 22 and the external environment may require a large, sudden deflection of the diaphragm leading to a pressure wave inside controlled environment 22. As discussed above, such a situation is not desirable. As seen in FIG. 5B, another embodiment of the instant invention provides for a filtered passage 1000 connecting the external environment with the volume of the controlled environment 22. One embodiment of such a filtered passageway is a composite diaphragm 488 illustrated in FIG. 9. Diaphragm 488 is a flexible, dish-shaped diaphragm with circumferential ridges to provide structural rigidity and a circumferential groove 474 but with a central region formed of a filter material 490. Filter material 490 provides a faster pressure equalization response at higher pressure differentials by providing a filtered passageway so that air from the external environment can enter into reticle container 10 but contaminating particulates can be precluded from entry. Diaphragm 488 responds to relatively smaller pressure differentials which occur more frequently but which do not provide the pressure potential to overcome flow path resistance for ambient air to transverse the fine pore size of the filter. Secondly, filter material 490 modulates the deflection of the diaphragm so that the diaphragm-filter combination moves the air volume inside the controlled environment 22 in a quasi-static manner much like a piston pump would rather than the turbulent displacement generated by a sudden movement of the flexible diaphragm.

In an alternate embodiment, flexible diaphragm 470 may be augmented by a flow passageway 1000 illustrated in FIG. 5B appropriately located in the container body so as to communicate controlled environment 22 across a filter barrier (not illustrated). One embodiment provides for reticle container 10 to incorporate a thin-walled section 1005 at an appropriate location to act as a diaphragm with or without an auxiliary filtered flow passageway as illustrated in FIG. 6B. Preferably, the thin walled section deflects to accommodate a change of volume change of about 7 to 10% and a preferred volume change of 30% and is therefore much more deflectable than the other walls of the container. The thin walled section may be present below the automation flange 1015.

An example of a diaphragm may be a membrane gas filter, or the like. An example of a filter barrier across a filtered passageway can be an aperture hole through reticle container 10 plugged with a sintered powder metal gas filter, or the like as may be known in the art.

Another embodiment of reticle container 10 provides for a path to ground for electrostatic dissipation from the top and bottom surface of the reticle 26 through the reticle support and isolation mechanism and the walls of reticle container 10. The reticle 26 is thereby protected from ESD. The method and apparatus is discussed in U.S. Pat. No. 6,513,654 to Asyst Technologies Inc., the contents of which are incorporated herein by reference.

Figure 11:
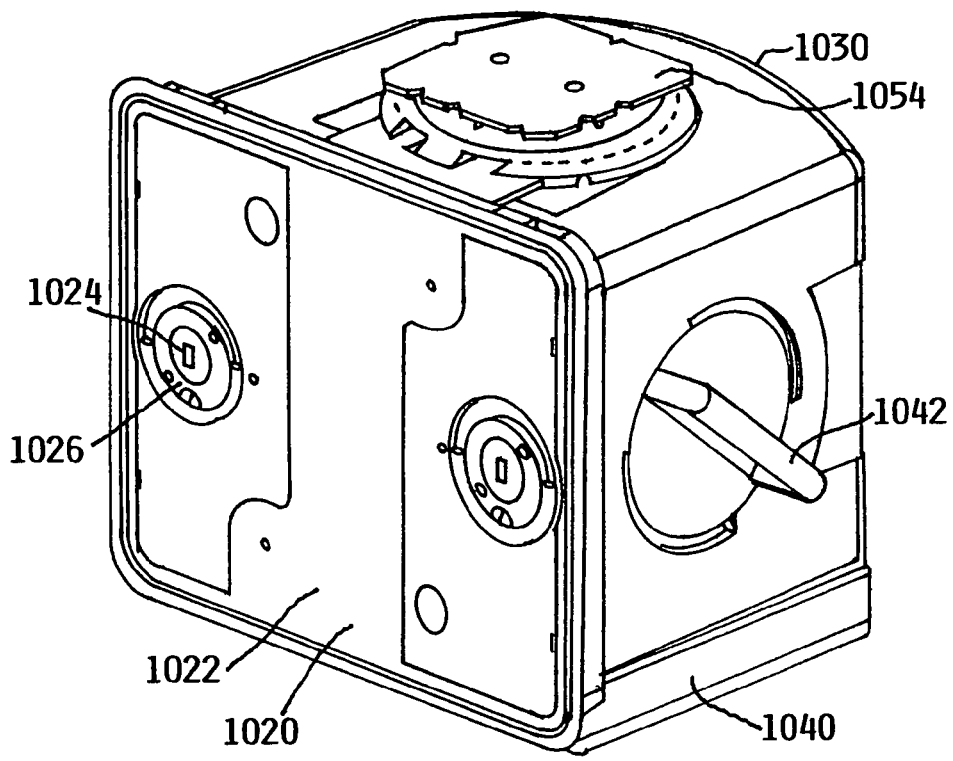
FIG. 11 is a perspective view of a front opening wafer container embodying the invention herein.
Figure 12:
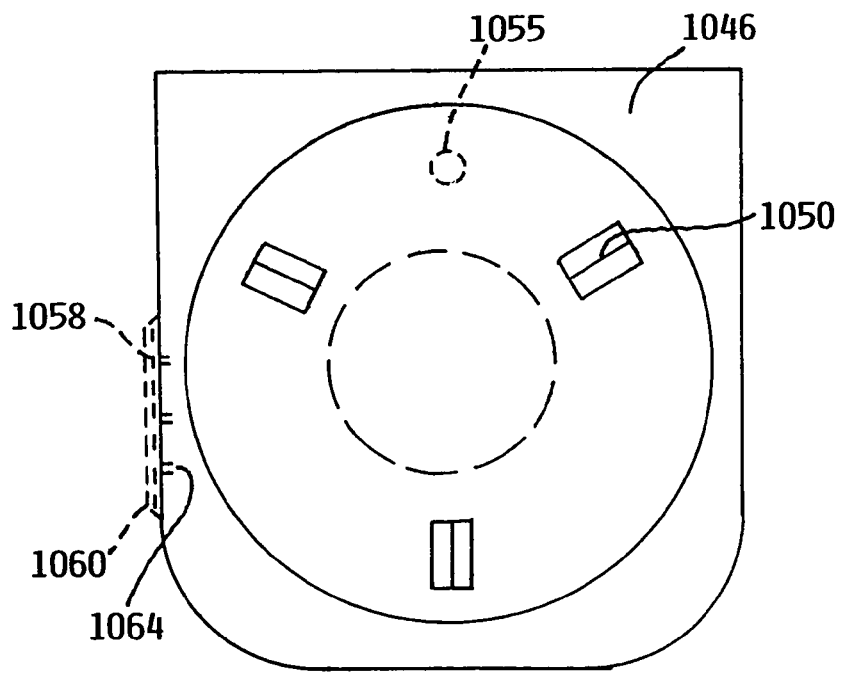
FIG. 12 is a bottom view of the container of FIG. 11.

Referring to FIGS. 11 and 12, a front opening wafer container 1020 configured for 300 mm wafers has a front door 1022 with key holes 1024 as part of the latch mechanisms 1026 for latching and releasing the door from the shell portion 1030. Side walls 1040 may receive handles 1042, a bottom side 1046 has a kinematic coupling 1050, and a top side has a robotic handling flange 1054 is illustrated. Such containers may utilize the invention herein by utilizing diaphragms as disclosed above. Utilizing filters 1 1055 in these containers for pressure equalization is well known, see. The wafers in such containers lay horizontal and are stacked vertically in a spaced array. A diaphragm may be positioned in the bottom side in the wall structure to provide coaxial alignment with the wafers. Other suitable locations for the diaphragms may be the front door, the top side, the side walls, or the back wall. The diaphragm 1058 could be attached with a separate housing 1060 and with vents 1064 through the walls. The housing could be assembled or welded onto the shell. Moreover, a defined thin wall section that can discretely move separate from the surrounding thicker wall may be suitable in these containers.

The above embodiments are intended to be illustrative and not limiting. Additional embodiments are within the claims. Although the present invention has been described with reference to particular embodiments, workers skilled in the art will recognize that changes may be made in form in detail with departing from the spirit and scope of the invention.

What is claimed is:

1. A pod for containing a particulate sensitive substrate and for providing pressure equalization between the exterior and an interior environment of the pod and for minimizing gaseous fluid flow inside adjacent to the particulate sensitive substrate, the pod comprising:
   a primary pod including a base and a cover, the cover configured with a concave inner surface opposite an outer surface, the cover adapted to removably engage the base to define a first enclosure having a first volume between the concave inner surface and the base, the cover having an aperture;
   a diaphragm positioned in the cover, the diaphragm having a normal undeflected position, the diaphragm dividing the first volume between a second volume in communication with the exterior of the pod, and a third volume not in fluid communication with the exterior of the pod, the diaphragm deflectable from the normal undeflected position; and
   a secondary pod disposed in the primary pod, the secondary pod comprising a lower portion and an upper portion, the upper portion adapted to interface with the lower portion to define a second enclosure characterized by a second enclosure volume for containing the particulate sensitive substrate, the lower portion comprising support structure to removably hold the particulate sensitive substrate thereupon and the upper portion comprising retaining structure for retaining the particulate sensitive substrate when the upper portion is engaged with the lower portion.

2. The pod of claim 1 wherein the diaphragm is substantially concentrically positioned with respect to the particulate sensitive substrate therein.

3. The pod of claim 2 wherein the diaphragm comprises an operative portion movable from the normal undeflected position to deflected positions.

4. The pod of claim 3 wherein the operative portion includes a first portion and a second portion, said first portion being gaseous fluid impermeable and said second portion being gaseous fluid permeable.

5. The pod of claim 1 further comprising a filter attached to the pod and providing gaseous fluid communication between the exterior of the pod and the interior of the pod.

6. The pod of claim 1 wherein the diaphragm has an operative portion at least a part of the operative portion is provided with a structure of concentric ridges.

7. The pod of claim 6 wherein the diaphragm is formed of an elastomeric material.

8. The pod of claim 7 wherein the cover is comprised of a first shell portion with an aperture sized to approximately the size of the diaphragm, and a second shell portion covering said aperture of the first shell portion, said second shell portion and the diaphragm defining the second volume.

9. The pod of claim 8 wherein the second shell portion comprises a domed wall and said the second shell portion comprises a pair of projections extending laterally outward in a horizontal orientation from the domed wall.

10. The pod of claim 1 wherein the primary pod, the secondary pod, and the diaphragm are all concentrically positioned.

11. The pod of claim 1 wherein the secondary pod provides a barrier to particulate entry by way of a restriction having an air gap.

12. The pod of claim 1 wherein the base has an upwardly facing surface and the upper portion of the secondary pod has a downwardly facing peripheral lip, and wherein said peripheral lip confronts the base without contacting same defining a gap extending between said lip and the upwardly facing surface of the base.

* * * * *

UNITED STATES PATENT AND TRADEMARK OFFICE
CERTIFICATE OF CORRECTION

| | | |
|---|---|---|
| PATENT NO. | : 7,528,936 B2 | Page 1 of 1 |
| APPLICATION NO. | : 11/364860 | |
| DATED | : May 5, 2009 | |
| INVENTOR(S) | : Barry Gregerson et al. | |

It is certified that error appears in the above-identified patent and that said Letters Patent is hereby corrected as shown below:

In the Specification

In Column 3, Line 13, delete "having" and insert --have--, therefor

In Column 9, Line 56, delete "is" and insert --as--, therefor

In Column 9, Line 58, delete "filters1" and insert --fillers--, therefor

In Column 9, Line 59, delete ", see" and insert --.--, therefor

In Column 10, Line 9, delete "in" and insert --or--, therefor

Signed and Sealed this
Twenty-fourth Day of February, 2015

Michelle K. Lee
*Deputy Director of the United States Patent and Trademark Office*